United States Patent
Ikari

(10) Patent No.: US 11,472,745 B2
(45) Date of Patent: Oct. 18, 2022

(54) PARAMAGNETIC GARNET-TYPE TRANSPARENT CERAMIC, MAGNETO-OPTICAL MATERIAL, AND MAGNETO-OPTICAL DEVICE

(71) Applicant: Shin-Etsu Chemical Co., Ltd., Tokyo (JP)

(72) Inventor: Masanori Ikari, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 548 days.

(21) Appl. No.: 16/605,574

(22) PCT Filed: Apr. 4, 2018

(86) PCT No.: PCT/JP2018/014437
§ 371 (c)(1),
(2) Date: Oct. 16, 2019

(87) PCT Pub. No.: WO2018/193848
PCT Pub. Date: Oct. 25, 2018

(65) Prior Publication Data
US 2020/0117026 A1    Apr. 16, 2020

(30) Foreign Application Priority Data

Apr. 17, 2017 (JP) .............................. JP2017-081418

(51) Int. Cl.
| | |
|---|---|
| *C04B 35/44* | (2006.01) |
| *C04B 35/50* | (2006.01) |
| *C04B 35/64* | (2006.01) |
| *C30B 29/28* | (2006.01) |
| *G02F 1/00* | (2006.01) |
| *G02F 1/09* | (2006.01) |

(52) U.S. Cl.
CPC .............. *C04B 35/44* (2013.01); *C04B 35/50* (2013.01); *C04B 35/64* (2013.01); *C30B 29/28* (2013.01); *G02F 1/0036* (2013.01); *G02F 1/093* (2013.01)

(58) Field of Classification Search
CPC ......... C04B 35/44; C04B 35/50; C04B 35/64; C30B 29/28; G02F 1/0036; G02F 1/093
See application file for complete search history.

(56) References Cited

U.S. PATENT DOCUMENTS

| | | |
|---|---|---|
| 2004/0035357 A1 | 2/2004 | Sekijima et al. |
| 2005/0157219 A1 | 7/2005 | Sekijima et al. |
| (Continued) | | |

FOREIGN PATENT DOCUMENTS

| | | |
|---|---|---|
| JP | 2002-293693 A | 10/2002 |
| JP | 3642063 B2 | 4/2005 |
| (Continued) | | |

OTHER PUBLICATIONS

International Search Report dated Jun. 26, 2018, issued in counterpart International Application No. PCT/JP2018/014437 (2 pages).

*Primary Examiner* — James A Fiorito
(74) *Attorney, Agent, or Firm* — WHDA, LLP

(57) ABSTRACT

A paramagnetic garnet-type transparent ceramic characterized by being a sintered body of a terbium-containing composite oxide represented by formula (1) in which the linear transmittance at a wavelength of 1,064 nm at an optical path length of 15 mm is 83% or higher.

$$(Tb_{1-x-y}Sc_xCe_y)_3(Al_{1-z}Sc_z)_5O_{12} \qquad (1)$$

(In the formula, $0<x<0.08$, $0\leq y\leq 0.01$, $0.004<z<0.16$.)

8 Claims, 2 Drawing Sheets

(56) References Cited

U.S. PATENT DOCUMENTS

2013/0038927 A1 2/2013 Hatanaka et al.
2016/0145765 A1 5/2016 Matsui et al.
2017/0205643 A1 7/2017 Makikawa et al.

FOREIGN PATENT DOCUMENTS

| JP | 2008-7385 A | 1/2008 |
| JP | 4107292 B2 | 6/2008 |
| JP | 2011-213552 A | 10/2011 |
| JP | 5611329 B2 | 10/2014 |
| JP | 5935764 B2 | 6/2016 |
| JP | 2017-49560 A | 3/2017 |
| WO | 2007/118191 A2 | 10/2007 |
| WO | 2015/186656 A1 | 12/2015 |

SIDE OF SAMPLE

OPTICALLY POLISHED SURFACE OF SAMPLE

PARAMAGNETIC GARNET-TYPE TRANSPARENT CERAMIC, MAGNETO-OPTICAL MATERIAL, AND MAGNETO-OPTICAL DEVICE

TECHNICAL FIELD

The present invention relates to a paramagnetic garnet-type transparent ceramic, and more particularly to a magneto-optical material made of a garnet-type transparent ceramic containing terbium, which is suitable for constituting a magneto-optical device such as an optical isolator, and to a magneto-optical device using the magneto-optical material.

BACKGROUND ART

In recent years, as high power of fiber lasers has become possible, the spread of laser processing machines using fiber lasers is remarkable. Incidentally, as for a laser light source built in a laser processing machine, when light from the outside is input, a resonance state becomes unstable, and a phenomenon in which the oscillation state is disturbed occurs. Especially when the oscillated light is reflected by an optical system on the way and returns to the light source, the oscillation state is greatly disturbed. In order to prevent this, an optical isolator is usually provided in front of the light source, or the like.

The optical isolator is constituted by a Faraday rotator, a polarizer disposed on the light incident side of the Faraday rotator, and an analyzer disposed on the light emission side of the Faraday rotator. In addition, the Faraday rotator applies a magnetic field parallel to the traveling direction of the light to be utilized. At this time, the polarized wave component of the light rotates only in a certain direction regardless of forward or backward traveling in the Faraday rotator. Furthermore, the Faraday rotator is adjusted to a length that the polarized wave component of the light is rotated by exactly 45 degrees. Herein, when the polarization planes of the polarizer and the analyzer are shifted by 45 degrees in the rotation direction of the forward traveling light, the polarized waves of the forward traveling light coincide at the position of the polarizer and at the position of the analyzer, and the forward traveling light is transmitted. On the other hand, the polarized waves of the backward traveling light are rotated by 45 degrees in the direction opposite to the deviation angle direction of the polarization plane of the polarizer shifted by 45 degrees from the position of the analyzer. Then, the polarization plane of the return light at the position of the polarizer is shifted by 45 degrees−(−45 degrees)=90 degrees from the polarization plane of the polarizer, and the return light cannot be transmitted. In this way, the optical isolator functions to transmit and emit the forward traveling light and block the return light traveling backward.

A TGG crystal ($Tb_3Ga_5O_{12}$) and a TSAG crystal (($Tb_{(3-x)}Sc_x)Sc_2Al_3O_{12}$) are conventionally known as materials used as a Faraday rotator constituting the above optical isolator (JP-A 2011-213552 (Patent Document 1) and JP-A 2002-293693 (Patent Document 2)). The TGG crystal is now widely used for standard fiber laser devices. Meanwhile, the Verdet constant of the TSAG crystal is said to be about 1.3 times that of the TGG crystal, and this is also a suitable material mounted in the fiber laser devices. However, since Sc is a very expensive raw material, the TSAG crystal is not employed due to the manufacturing costs.

Although the development of the TSAG crystal has been still continued as in JP 5611329 (Patent Document 3) and JP 5935764 (Patent Document 4), none can achieve reduction in Sc usage so that the TSAG crystal is not widely used.

Other than the above, a TAG crystal ($Tb_3Al_5O_{12}$) has been known for a long time as a Faraday rotator with the Verdet constant greater than that of the TSAG. However, since the TAG crystal is an incongruent melting crystal, there is a restriction that a perovskite phase is first formed (precipitated) at a solid-liquid interface and then a TAG phase is formed (precipitated). In other words, the TAG crystal can be grown only in a state where the garnet phase and the perovskite phase are always mixedly present, and good-quality, large-size TAG crystal growth has not been realized.

JP 3642063 (Patent Document 5) and JP 4107292 (Patent Document 6) propose, as a means for suppressing this mixed crystal, a process for preferentially precipitating the perovskite phase, which is the initial phase, in a porous medium by making a polycrystalline raw material rod or a seed crystal for FZ growth porous. However, in reality, as the melted position moves, the position where the perovskite phase is likely to precipitate also moves. Thus, even if only the interface of the seed crystal and the polycrystalline raw material rod was made porous, it was inherently impossible to suppress the precipitation of the perovskite phase completely.

Under such restrictions, JP-A 2008-7385 (Patent Document 7) has proposed a material for creating the oxide of the TAG composition by ceramics and giving translucency. The ceramics can be produced by sintering at a temperature lower than the melting point by 100° C. or more so that it is possible to clear the problem of incongruent melting, which has been the problem in the single crystal growth. The decomposition of the TAG actually begins at 1,840° C. or more. Thus, if sintering densification can be done to the highest theoretical density at this temperature or less, a transparent sintered body of the TAG single phase can be obtained.

Patent Document 7 discloses a process for producing a ceramic that has a garnet structure and is composed of terbium aluminum oxide, and the process includes the steps of: compounding raw materials; calcining; crushing the calcined powder; forming; and firing, in which a TAG ceramic with high light transmittance can be created if the average particle size of the calcined powder after the crushing is 0.2 μm to 1.6 μm in the step of crushing the calcined powder, and the density after the forming is 3.26 g/cm³ or more in the step of forming.

However, according to Patent Document 7, the translucency is extremely insufficient, and even the maximum linear transmittance with the thickness of 1.5 mm was only 35%. By the way, in a case where the TAG is utilized as a Faraday element such as an optical isolator, for example, the element length necessary for rotating the light by 45 degrees is about 15 mm for a 1.06 μm band laser, which is approximately ten times the length in the document. For the material with light transmittance of 35% with the thickness of 1.5 mm, if the element length thereof is elongated by ten times, the transmittance becomes less than 0.01%, that is, nearly zero, and the element does not function at all.

That is, even with a ceramic production process capable of suppressing the occurrence of different phases, the TAG of a practical level has not existed so far. Note that Patent Document 6 indicates that the Verdet constant increases as compared with the TAG when Ce is substituted for some Tb in the TAG crystal. As the Verdet constant increases, the element length necessary for rotating the incident light by 45 degrees can be shortened. Thus, the total absorbed amount is reduced. However, with the linear transmittance of 35% with the thickness of 1.5 mm, the 45 degree rotation thickness transmittance is less than 1% even if the element length is halved. This is far from practical use.

PRIOR ART DOCUMENTS

Patent Documents

Patent Document 1: JP-A 2011-213552
Patent Document 2: JP-A 2002-293693
Patent Document 3: JP 5611329
Patent Document 4: JP 5935764
Patent Document 5: JP 3642063
Patent Document 6: JP 4107292
Patent Document 7: JP-A 2008-7385

SUMMARY OF INVENTION

Technical Problem

The present invention has been made in light of the above circumstances, and an object thereof is to provide a paramagnetic garnet-type transparent ceramic, which is a sintered body of paramagnetic garnet-type oxide containing terbium, having a linear transmittance of 83% or more at a wavelength of 1,064 nm for a length of 15 mm, a magneto-optical material, and a magneto-optical device using the magneto-optical material.

Solution to Problem

That is, the present invention is the following paramagnetic garnet-type transparent ceramic, magneto-optical material and magneto-optical device.

[1] A paramagnetic garnet-type transparent ceramic, which is a sintered body of complex oxide represented by the following formula (1), having a linear transmittance of 83% or more at a wavelength of 1,064 nm for an optical path length of 15 mm:

$$(Tb_{1-x-y}Sc_xCe_y)_3(Al_{1-z}Sc_z)_5O_{12} \quad (1)$$

wherein $0 < x < 0.08$, $0 \leq y \leq 0.01$, and $0.004 < z < 0.16$.

[2] The paramagnetic garnet-type transparent ceramic according to [1] including $SiO_2$ as a sintering aid in an amount of more than 0% by weight to 0.1% by weight or less.

[3] The paramagnetic garnet-type transparent ceramic according to [1] or [2], wherein an oxygen deficiency amount calculated from a difference between an actual density and a theoretical density of a transparent ceramic is less than 0.1%.

[4] The paramagnetic garnet-type transparent ceramic according to any one of [1] to [3], wherein a Verdet constant at the wavelength of 1,064 nm is 51 rad/(T·m) or more.

[5] The paramagnetic garnet-type transparent ceramic according to any one of [1] to [4], wherein a temperature rise is 20° C. or less when a laser beam with the wavelength of 1,064 nm is input thereto for 20 minutes with a beam diameter of 1.6 mm and input power of 100 W, for the optical path length of 15 mm.

[6] A magneto-optical material made of the paramagnetic garnet-type transparent ceramic according to any one of [1] to [5].

[7] A magneto-optical device configured by using the magneto-optical material according to [6].

[8] The magneto-optical device according to [7], including the paramagnetic garnet-type transparent ceramic as a Faraday rotator, wherein the magneto-optical device is an optical isolator which includes a polarization material in front of and behind the Faraday rotator on an optical axis and is usable at a wavelength band of 0.9 μm or more to 1.1 μm or less.

Advantageous Effects of Invention

According to the present invention, it is possible to provide a truly practical TAG-based oxide transparent ceramic material, which is paramagnetic garnet-type oxide containing terbium, has a Verdet constant greater than that of TGG and a linear transmittance of 83% or more at a wavelength of 1,064 nm for a length of 15 mm to have truly practical transparency, and is a ceramic sintered body which is easily scaled up.

BRIEF DESCRIPTION OF DRAWINGS

FIGS. 2(a) and 2(b) are photographs showing the optical appearance checking results of the sample in Example 1, in which FIG. 2(a) is the appearance of the side of the sample, and FIG. 2(b) is the appearance of the optically polished surface of the sample.

DESCRIPTION OF EMBODIMENTS

<Paramagnetic Garnet-Type Transparent Ceramic>

Figure 1:
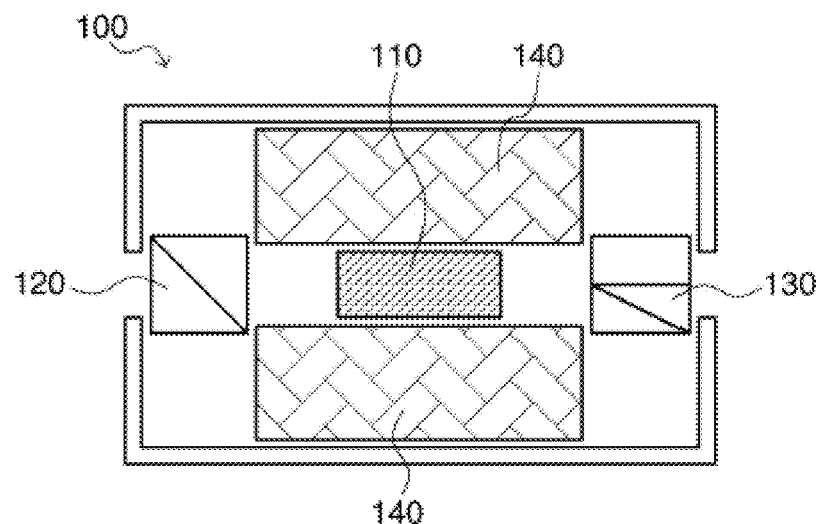
FIG. 1 is a schematic cross-sectional view showing a configuration example of an optical isolator using a magneto-optical material according to the present invention as a Faraday rotator.

Hereinafter, a paramagnetic garnet-type transparent ceramic of the present invention is described.

A paramagnetic garnet-type transparent ceramic material according to the present invention is a sintered body of complex oxide represented by the following formula (1), and has a linear transmittance of 83% or more at a wavelength of 1,064 nm for an optical path length of 15 mm:

$$(Tb_{1-x-y}Sc_xCe_y)_3(Al_{1-z}Sc_z)_5O_{12} \quad (1)$$

wherein $0 < x < 0.08$, $0 \leq y \leq 0.01$, and $0.004 < z < 0.16$.

In the formula (1), terbium (Tb) is the material having the greatest Verdet constant among the paramagnetic elements excluding iron (Fe) and is the element most suitable to be used for an optical isolator at a wavelength region of 1,064 nm since the material is completely transparent in this wavelength region especially when terbium is contained in the oxide having a garnet structure.

Aluminum (Al) is the material having the shortest ionic radius among trivalent ions that can stably exist in oxide having a garnet structure, and is the element that can minimize the lattice constant of the terbium-containing paramagnetic garnet-type oxide. If the lattice constant of the garnet structure can be decreased without changing the terbium content, the Verdet constant per unit length can be increased, which is preferable. For this reason, the Verdet constant of TAG is actually 1.25 to 1.5 times that of TGG.

Scandium (Sc) is a material that has an intermediate ionic radius and can be solid solution in both the terbium site and part of the aluminum site in the oxide having a garnet structure. Scandium (Sc) is also a buffer material that can be solid solution by adjusting the distribution ratio thereof to terbium site and the aluminum site so as to exactly match the stoichiometric ratio and thereby minimize the generation energy of the crystallite when the compounding ratio of terbium to aluminum is deviated from the stoichiometric ratio due to variation at the time of weighing. In addition, Sc is an element that can limit the abundance of the alumina different phase to 1 ppm or less and limit the abundance of the perovskite-type different phase to 1 ppm or less, and is an essential element in the present invention.

Cerium (Ce) is a material that can be solid solution in terbium oxide, thereby expanding the absorption range to a wavelength longer than 488 nm and lifting the symmetric degeneracy to increase spin-orbit interaction splitting. For this reason, the Verdet constant can be increased when a laser beam with a wavelength of 1,064 nm is input. Thus, Ce is an element preferred to be added in the present invention. However, if Ce is substituted and solutionized too much, the influence of absorption at a wavelength of 1,064 nm cannot be ignored, which is unpreferable.

In the formula (1), the range of x is preferably $0<x<0.08$, more preferably $0.002 \leq x \leq 0.07$, and still more preferably $0.003 \leq x \leq 0.06$. If x is in this range, the perovskite-type different phase can be reduced to a level that cannot be detected by X-ray diffraction (XRD) analysis. Furthermore, the abundance of the perovskite-type different phase (which has a typical size of 1 μm to 1.5 μm in diameter and is granular appearing to be colored by light brown) in a viewing field of 150 μm×150 μm by optical microscope observation is one or less, which is preferable. The abundance of the perovskite-type different phase at this time in the garnet parent phase is 1 ppm or less.

When x=0, the perovskite-type different phase is highly likely to precipitate, which is unpreferable. Furthermore, when x is 0.08 or more, while the effect of suppressing precipitation of the perovskite-type different phase is saturated and does not change, the solid solution abundance of terbium is unnecessarily reduced, and the Verdet constant is decreased, which is unpreferable. Moreover, scandium is expensive as a raw material, so unnecessary excessive doping of scandium is unpreferable from the viewpoint of the production costs.

In the formula (1), the range of y is preferably $0 \leq y \leq 0.01$, and more preferably $0.001 \leq y \leq 0.01$ if Ce is contained. Even if cerium is not doped at all, it does not matter because the paramagnetic garnet-type transparent ceramic in the present invention has a sufficiently large Verdet constant (52 to 60 rad/(T·m)) at a wavelength of 1,064 nm. However, if cerium is doped in the range of $0 \leq y \leq 0.01$, the Verdet constant can be further increased, which is preferable. However, if y exceeds 0.01, the temperature rise of the material exceeds 20° C. when a laser beam with a high power of 100 W and a wavelength of 1,064 nm is input. Then, the temperature exceeds the acceptance specification of the thermal lens of the fiber laser processing machine, which is unpreferable.

In the formula (1), the range of z is preferably $0.004<z<0.16$, more preferably $0.01 \leq z \leq 0.15$, and still more preferably $0.03 \leq z \leq 0.15$. If z is in this range, the perovskite-type different phase cannot be detected by XRD analysis. Furthermore, the abundance of the perovskite-type different phase (which has a typical size of 1 μm to 1.5 μm in diameter and is granular appearing to be colored by light brown) in a viewing field of 150 μm×150 μm by optical microscope observation is one or less, which is preferable. The abundance of the perovskite-type different phase at this time is 1 ppm or less.

When z is 0.004 or less, the perovskite-type different phase is highly likely to precipitate, which is unpreferable.

Furthermore, when z is 0.16 or more, while the effect of suppressing precipitation of the perovskite-type different phase is saturated and does not change, the solid solution abundance of terbium is unnecessarily reduced, and the Verdet constant is decreased, which is unpreferable. Moreover, scandium is expensive as a raw material, so unnecessary excessive doping of scandium is unpreferable from the viewpoint of the production costs.

The paramagnetic garnet-type transparent ceramic of the present invention contains as a main component the complex oxide represented by the aforementioned formula (1). Furthermore, as a subcomponent, it is preferable to add $SiO_2$ which serves as a sintering aid in a range with the upper limit of 0.1% by weight or less. If a trace amount of $SiO_2$ is added as a sintering aid, the precipitation of the perovskite-type different phase is suppressed, and the transparency of the paramagnetic garnet-type transparent ceramic is further improved, which is preferable. However, if $SiO_2$ is added in an amount of more than 0.1% by weight, the temperature rise exceeds 20° C. when the paramagnetic garnet-type transparent ceramic with a length (optical path length) of 15 mm is irradiated with a laser beam of 100 W and a wavelength of 1,064 nm. In this case, when a high power laser beam is input, a thermal lens is generated, which is unpreferable.

Incidentally, "containing as a main component" means that 90% by weight or more of the complex oxide represented by the aforementioned formula (1) is contained. The complex oxide content, in which the complex oxide is represented by the formula (1), is preferably 99% by weight or more, more preferably 99.9% by weight or more, still more preferably 99.99% by weight or more, and particularly preferably 99.999% by weight or more.

The paramagnetic garnet-type transparent ceramic of the present invention is composed of the above main component and subcomponent, but may further contain other elements. Typical examples of other elements include rare earth elements, such as yttrium (Y) and lutetium (Lu), or various impurities such as sodium (Na), calcium (Ca), magnesium (Mg), phosphorus (P), tungsten (Ta), and molybdenum (Mo).

The other element content is preferably 10 parts by weight or less, more preferably 0.1 parts by weight or less, and particularly preferably 0.001 part by weight or less (substantially zero) when the total amount of Tb is defined as 100 parts by weight.

In the paramagnetic garnet-type transparent ceramic of the present invention, it is preferable that the oxygen deficiency amount calculated from the difference between the actual density and the theoretical density of a transparent ceramic is less than 0.1%. For this reason, it is possible to improve the characteristics required for the transparent ceramic (linear transmittance, suppression of absorbing a laser beam with a wavelength of 1,064 nm, and the like). Note that, the oxygen deficiency amount is calculated as follows: the actual weight of the transparent ceramic is measured and divided by the volume thereof to obtain the density; the difference between a theoretical density of the paramagnetic garnet-type transparent ceramic $Tb_3Al_5O_{12}$ (6.06 g/cm$^3$) and a theoretical density when Sc or Ce is substituted for part of the composition (5.98 to 6.06 g/cm$^3$) is calculated; and the value is divided by the theoretical density and then multiplied by 100 to obtain the occurrence amount of oxygen deficiency (%).

The paramagnetic garnet-type transparent ceramic of the present invention exhibits a colorless transparent appearance and has a linear transmittance of 83% or more at a wavelength of 1,064 nm for an optical path length of 15 mm. Note that, in the present invention, "linear transmittance" means a ratio of the intensity of the light with a target wavelength after the light is transmitted through a transparent ceramic sample when transmission spectrum (the intensity of the light) for the target wavelength measured in a blank (space) state where the sample is not placed in the measurement optical path is defined as 100%. That is, when the intensity of the light with a target wavelength (the intensity of the incident light) measured in the blank state is defined as $I_0$ and the intensity of the light after the light is transmitted through the transparent ceramic sample is defined as I, the linear transmittance can be expressed as $I/I_0 \times 100(\%)$.

In the paramagnetic garnet-type transparent ceramic of the present invention, the Verdet constant at a wavelength of 1,064 nm is preferably 51 rad/(T·m) or more, and more preferably 55 rad/(T·m) or more.

In the paramagnetic garnet-type transparent ceramic of the present invention, it is preferable that the temperature rise is 20° C. or less when a laser beam with a wavelength of 1,064 nm is input thereto for 20 minutes with a beam diameter of 1.6 mm and incident power of 100 W, for an optical path length of 15 mm.

<Process for Producing Paramagnetic Garnet-Type Transparent Ceramic>

[Material]

As a raw material used in the present invention, a metal powder composed of terbium, scandium, aluminum, and cerium, its aqueous solution of nitric acid, sulfuric acid, uric acid, and the like, an oxide powder of the above elements, or the like can be suitably utilized.

Predetermined amounts of these elements are weighed, mixed, and fired to obtain a fired raw material mainly composed of a cubic crystal garnet-type oxide with a desired configuration. The firing temperature at this time is a temperature of preferably 1,100° C. or more and lower than the sintering temperature for the step performed thereafter, and more preferably a temperature of 1,200° C. or more and lower than the sintering temperature for the step performed thereafter. Note that "mainly composed of" as used herein indicates that the main peak obtained from the powder X-ray diffraction result of the fired raw material is of a diffraction peak derived from the garnet structure. Note that, when the abundance of the perovskite-type different phase is 1 ppm or less, substantially only the garnet single phase pattern is detected for the powder X-ray diffraction patterns.

Furthermore, it is preferable that the purity of each raw material is 99.9% by weight or more.

Next, the resulting fired raw material is crushed into raw material powder.

Note that a ceramic is finally produced by using the garnet-type oxide powder with the desired configuration, but the shape of the powder at that time is not particularly limited, and, for example, an angular, spherical, or tabular powder can be suitably utilized. Furthermore, even a powder that is secondarily coagulated can be suitably utilized, and even a granular powder obtained by granulation by granulation treatment such as spray-drying treatment can be suitably utilized. In addition, the step of preparing these raw material powders is not particularly limited. A raw material powder created by a coprecipitation method, a crushing method, a spray-pyrolysis method, a sol-gel method, an alkoxide hydrolysis method, or any other synthesis method can be suitably utilized. Furthermore, the resulting raw material powder may be treated by a wet ball mill, a bead mill, a jet mill, a dry jet mill, a hammer mill, or the like as appropriate.

Various organic additives may be added to the garnet-type oxide powder raw material used in the present invention for the purpose of quality stability and yield improvement in the subsequent step of producing the ceramic. In the present invention, these are also not particularly limited. That is, various dispersants, binders, lubricants, plasticizers, and the like can be suitably utilized. However, for these organic additives, it is preferable to select a high-purity type free of unnecessary metal ions.

[Production Steps]

In the present invention, the above raw material powder is pressed into a predetermined shape, and then degreased and sintered thereafter to create a densified sintered body with a relative density of at least 95% or more. It is preferable to perform a hot isostatic pressing (HIP) treatment as a subsequent step. Note that, if the hot isostatic pressing (HIP) treatment is directly conducted, the paramagnetic garnet-type transparent ceramic is reduced, and oxygen deficiency of 0.1% or more occurs. Thus, it is preferable to perform a slightly oxidized HIP treatment or to oxidize the atmosphere in the final high temperature treatment step after an HIP treatment in order to conduct an oxygen deficiency recovery annealing treatment. With this step, the oxygen deficiency amount calculated from the difference between the actual density and the theoretical density of the transparent ceramic can be less than 0.1%.

(Forming)

In the production process of the present invention, a common pressing step can be suitably utilized. That is, a pressing step in which a common mold filled with the raw material powder is pressurized in a certain direction or a cold isostatic pressing (CIP) step in which a deformable waterproof container hermetically accommodating the raw material powder is pressurized with hydrostatic pressure can be utilized. Note that the applied pressure is not particularly limited and should be adjusted as appropriate while the relative density of the resulting compact is checked. For example, if the applied pressure is managed in a pressure range of about 300 MPa or less, which can be handled by a commercially available CIP device, the manufacturing costs can be suppressed. Alternatively, a hot pressing step, a discharging plasma sintering step, a microwave heating step, or the like, in which not only the forming step but also the sintering are carried out at once, can also be suitably utilized at the time of forming. Moreover, it is also possible to create a compact by a slip casting method instead of a pressing method. By optimizing the combination of the shape and size of the oxide powder, which is the starting material, and various organic additives, forming methods, such as pressure casting, centrifugal casting, and extrusion forming, can also be employed.

(Degreasing)

In the production process of the present invention, a common degreasing step can be suitably utilized. That is, it is possible to undergo a temperature rising degreasing step using a heating furnace. Moreover, the type of the atmosphere gas at this time is also not particularly limited, and air, oxygen, hydrogen, and the like can be suitably utilized. The degreasing temperature is also not particularly limited. However, if a raw material mixed with an organic additive is used, it is preferable to raise the temperature to a temperature at which the organic component can be decomposed and eliminated.

(Sintering)

In the production process of the present invention, a common sintering step can be suitably utilized. That is, a heat sintering step, such as a resistance heating method and an induction heating method, can be suitably utilized. The atmosphere at this time is not particularly limited, and it is possible to sinter under various atmospheres of inert gas, oxygen gas, hydrogen gas, and the like, or also under reduced pressure (in vacuum). However, since it is preferable to eventually control the occurrence amount of oxygen deficiency to be less than 0.1%, an oxygen gas atmosphere and a reduced pressure oxygen gas atmosphere are exemplified as more preferable atmospheres.

The sintering temperature in the sintering step of the present invention is preferably 1,600 to 1,800° C., and particularly preferably 1,700 to 1,750° C. When the sintering temperature is in this range, different phase precipitation is suppressed, which is preferable.

The sintering retention time in the sintering step of the present invention is sufficient for about several hours, but the relative density of the sintered body must be densified to at least 95% or more. When the sintering retention time is long, ten hours or longer, and the relative density of the sintered body is densified to 99% or more, the final transparency is improved, which is more preferable.

(Hot Isostatic Pressing (HIP))

In the production process of the present invention, it is possible to further provide an additional hot isostatic pressing (HIP) treatment step after the sintering step.

Note that, as for the type of the pressurized gas medium at this time, inert gas such as argon and nitrogen, or Ar—$O_2$ can be suitably utilized. The pressure applied by the pressurized gas medium is preferably 50 to 300 MPa, and more preferably 100 to 300 MPa. If the pressure is less than 50 MPa, the transparency improving effect may not be obtained. If the pressure exceeds 300 MPa, no further transparency improvement is obtained even when the pressure is increased. Moreover, the load applied to the device becomes excessive, and the device may be damaged. It is convenient and preferable that the applied pressure be 196 MPa or less, which can be handled by a commercially available HIP device.

Moreover, the treatment temperature (predetermined retention temperature) at that time is set within the range from 1,000 to 1,800° C., and preferably from 1,100 to 1,700° C. If the heat treatment temperature exceeds 1,800° C., oxygen deficiency is likely to occur, which is unpreferable. Furthermore, if the heat treatment temperature is less than 1,000° C., the effect of improving transparency of the sintered body is hardly obtained. Note that the retention time of the heat treatment temperature is not particularly limited. However, if the heat treatment temperature is retained for a long time, oxygen deficiency is likely to occur, which is unpreferable. Typically, the retention time is preferably set within the range from one to three hours.

Note that the heater material, the heat insulating material and the treatment container subjected to the HIP treatment are not particularly limited, but graphite, or molybdenum (Mo), tungsten (W), and platinum (Pt) can be suitably utilized, and yttrium oxide and gadolinium oxide can also be further suitably utilized as the treatment container. When the treatment temperature is 1,500° C. or less in particular, platinum (Pt) can be used as the heater material, the heat insulating material and the treatment container, and the pressurized gas medium can be Ar—$O_2$. Thus, the occurrence amount of oxygen deficiency during the HIP treatment can be controlled to be less than 0.1%, which is preferable.

When the treatment temperature exceeds 1,500° C., graphite is preferable as the heater material and the heat insulating material. In this case, one of graphite, molybdenum (Mo) or tungsten (W) is selected as the treatment container, and one of yttrium oxide or gadolinium oxide is selected as a double container inside the treatment container. Then, if an oxygen release material is packed in the container, the occurrence amount of oxygen deficiency during the HIP treatment can be suppressed to the minimum, which is preferable.

(Annealing)

In the production process of the present invention, oxygen deficiency occurs in the resulting transparent ceramic sintered body after the HIP treatment is finished, and the transparent ceramic sintered body may exhibit a subtle light gray appearance. In that case, it is preferable to perform oxygen annealing treatment (oxygen deficiency recovery treatment) under an oxygen atmosphere at the HIP treatment temperature or less, typically 1,000 to 1,500° C. The retention time in this case is not particularly limited, but is preferably selected within a time period which is not less than a time sufficient for oxygen deficiency to recover and does not waste electricity cost due to unnecessarily long treatment.

By this oxygen annealing treatment, even the transparent ceramic sintered bodies, which have exhibited a subtle light gray appearance by the HIP treatment step, can be all paramagnetic garnet-type transparent ceramic bodies in which the occurrence amount of oxygen deficiency is limited to less than 0.1%.

(Optical Polishing)

In the production process of the present invention, it is preferable to optically polish both end faces, which are on the optically utilizing axis, of the paramagnetic garnet-type transparent ceramic that has undergone the above series of production steps. The optical surface accuracy at this time is preferably $\lambda/8$ or less and particularly preferably $\lambda/10$ or less, when the measurement wavelength $\lambda=633$ nm. Note that the optical loss can be further reduced by forming antireflection films as appropriate on the optically polished surfaces.

As described above, it is possible to provide a ceramic transparent sintered body that is the paramagnetic garnet-type oxide containing terbium and has a linear transmittance of 83% or more at a wavelength of 1,064 nm for a length (optical path length) of 15 mm. Furthermore, it is possible to realize the paramagnetic garnet-type transparent ceramic in which the Verdet constant at a wavelength of 1,064 nm is 51 rad/(T·m) or more and the temperature rise is 20° C. or less when a laser beam with a wavelength of 1,064 nm is input thereto for 20 minutes with a beam diameter of 1.6 mm and incident power of 100 W, for an optical path length of 15 mm, and to use the paramagnetic garnet-type transparent ceramic as a magneto-optical material in which generation of a thermal lens is suppressed.

[Magneto-Optical Device]

Furthermore, since the paramagnetic garnet-type transparent ceramic of the present invention is presumed to be utilized as a magneto-optical material, it is preferable to apply a magnetic field to the paramagnetic garnet-type transparent ceramic parallel to the optical axis thereof and then set a polarizer and an analyzer such that their optical axes are shifted from each other by 45 degrees, thereby constituting a magneto-optical device to be utilized. That is, the magneto-optical material according to the present invention is suitable for magneto-optical device applications and is suitably used as a Faraday rotator of an optical isolator at a wavelength of 0.9 to 1.1 μm in particular.

FIG. 1 is a schematic cross-sectional view showing one example of an optical isolator which is an optical device having, as an optical element, a Faraday rotator made of the magneto-optical material according to the present invention. In FIG. 1, an optical isolator 100 includes a Faraday rotator 110 made of the magneto-optical material according to the present invention, and a polarizer 120 and an analyzer 130, which are polarization materials, are provided in front of and behind the Faraday rotator 110, respectively. Further, in the optical isolator 100, it is preferable that the polarizer 120, the Faraday rotator 110, and the analyzer 130 be disposed in this order, and a magnet 140 be placed on at least one of the side faces thereof.

In addition, the above optical isolator 100 can be suitably utilized for industrial fiber laser devices. That is, the optical isolator 100 is suitable to prevent the reflected light of the laser light emitted from a laser light source from returning to the light source to cause unstable oscillation.

EXAMPLES

Hereinafter, the present invention is more specifically described with reference to Examples and Comparative Examples, but the present invention is not limited to the following Examples.

Examples 1 to 10, Comparative Examples 1 to 15

Terbium oxide powder, scandium oxide powder, and cerium oxide powder manufactured by Shin-Etsu Chemical Co., Ltd., and aluminum oxide powder manufactured by Taimei Chemicals Co., Ltd. were prepared. Moreover, a liquid of tetraethyl orthosilicate (TEOS) manufactured by Kishida Chemical Co., Ltd. was prepared. The purity was 99.9% by weight or more for all the powder raw materials and 99.999% by weight or more for the liquid raw material.

A total of 15 kinds of oxide raw materials No. 1 to 15, which become the final composition shown in Table 1, were created by using the above raw materials and adjusting the mixing ratios.

That is, mixed powders were prepared by weighing such that the numbers of moles of terbium, aluminum, and scandium were the respective mole fractions of the respective compositions in Table 1. When cerium was further doped, the mixed powder was prepared by weighing such that the numbers of moles of cerium was the mole fraction of the composition in Table 1. Subsequently, TEOS was weighed and added to each raw material such that the addition amount thereof became the % by weight in $SiO_2$ conversion in Table 1.

Then, dispersion and mixing treatment was carefully performed in ethanol in an alumina ball mill device, preventing the contamination with each other. The treatment time was 24 hours. Thereafter, a spray-drying treatment was performed to create granular raw materials all having an average grain size of 20 μm.

Then, these powders were put in an yttria crucible and subjected to a firing treatment in a high-temperature muffle furnace at 1,200° C. for a retention time of three hours to obtain fired raw materials with the respective compositions. Each resulting fired raw material was subjected to diffraction pattern analysis (XRD analysis) with a powder X-ray diffractometer manufactured by PANalytical. From the comparison between the reference data and the measured data of the X-ray diffraction patterns, the crystal systems of the samples were identified. In most cases (in the cases of the oxide raw materials No. 1 to 10 and 13 to 15), only the peak of the garnet single phase (cubic crystal) was detected. In the cases of the oxide raw materials No. 11 and 12, a weak peak of a perovskite different phase was detected besides the peak pattern of the garnet phase.

The above results are summarized in Table 1.

TABLE 1

| Oxide Raw Material No. | Composition | Sintering Aid $SiO_2$ (wt %) | Theoretical Density (g/cm³) | XRD Analysis |
|---|---|---|---|---|
| 1 | $(Tb_{0.996}Sc_{0.004})_3(Al_{0.97}Sc_{0.03})_5O_{12}$ | 0 | 6.05 | Garnet |
| 2 | $(Tb_{0.996}Sc_{0.004})_3(Al_{0.97}Sc_{0.03})_5O_{12}$ | 0.05 | 6.05 | Garnet |
| 3 | $(Tb_{0.995}Sc_{0.004}Ce_{0.001})_3(Al_{0.97}Sc_{0.03})_5O_{12}$ | 0.05 | 6.05 | Garnet |
| 4 | $(Tb_{0.991}Sc_{0.004}Ce_{0.005})_3(Al_{0.97}Sc_{0.03})_5O_{12}$ | 0.05 | 6.05 | Garnet |
| 5 | $(Tb_{0.986}Sc_{0.004}Ce_{0.01})_3(Al_{0.97}Sc_{0.03})_5O_{12}$ | 0.05 | 6.06 | Garnet |
| 6 | $(Tb_{0.991}Sc_{0.009})_3(Al_{0.93}Sc_{0.07})_5O_{12}$ | 0.09 | 6.03 | Garnet |
| 7 | $(Tb_{0.981}Sc_{0.019})_3(Al_{0.85}Sc_{0.15})_5O_{12}$ | 0.09 | 5.99 | Garnet |
| 8 | $(Tb_{0.985}Sc_{0.015})_3(Al_{0.97}Sc_{0.03})_5O_{12}$ | 0.05 | 6.05 | Garnet |
| 9 | $(Tb_{0.93}Sc_{0.07})_3(Al_{0.85}Sc_{0.15})_5O_{12}$ | 0.01 | 5.99 | Garnet |
| 10 | $(Tb_{0.995}Sc_{0.005})_3(Al_{0.987}Sc_{0.013})_5O_{12}$ | 0.07 | 6.06 | Garnet |
| 11 | $(Tb)_3(Al_{0.996}Sc_{0.004})_5O_{12}$ | 0.05 | 6.06 | Garnet + Perovskite |
| 12 | $(Tb)_3(Al)_5O_{12}$ | 0.05 | 6.06 | Garnet + Perovskite |
| 13 | $(Tb_{0.91}Sc_{0.09})_3(Al_{0.8}Sc_{0.2})_5O_{12}$ | 0.05 | 5.98 | Garnet |
| 14 | $(Tb_{0.976}Sc_{0.004}Ce_{0.02})_3(Al_{0.97}Sc_{0.03})_5O_{12}$ | 0.05 | 6.06 | Garnet |
| 15 | $(Tb_{0.996}Sc_{0.004})_3(Al_{0.97}Sc_{0.03})_5O_{12}$ | 0.2 | 6.05 | Garnet |

The oxide raw materials thus obtained were carefully dispersed and mixed again in ethanol in a nylon ball mill device, preventing the contamination with each other. However, a part of the raw materials of the oxide raw material No. 1 was set aside and subjected to a ball mill treatment using an alumina ball (Comparative Example 1-2). The treatment time was 24 hours in each case. Thereafter, a spray-drying treatment was performed to create granular raw materials all having an average grain size of 20 μm. The resulting 16 kinds of powder raw materials (15 kinds by the nylon ball mill and one type by the alumina ball mill) were all subjected to uniaxial pressing, and a hydrostatic press treatment under a pressure of 198 MPa to obtain CIP compacts. The resulting compacts were subjected to a degreasing treatment in a muffle furnace under the conditions of 1,000° C. and two hours. Subsequently, the dried compacts were placed in an oxygen atmosphere furnace and treated at 1,730° C. for three hours to obtain a total of 16 kinds of sintered bodies. At this time, the sintered relative density of each sample reached around 99%, and was over 98% at the lowest.

Each resulting sintered body was placed in a carbon heater HIP furnace and subjected to an HIP treatment under the conditions of Ar, 200 MPa, 1,600° C., and two hours. Furthermore, among the ceramic sintered bodies thus obtained, each often kinds of sintered bodies obtained from the oxide raw materials No. 1 to 10 that were not subjected to the alumina ball mill treatment (that is, the oxide raw materials subjected to the nylon ball mill treatment) was halved to obtain oxygen deficiency sintered bodies, and the other half of each was placed in an oxygen atmosphere furnace and subjected to an annealing treatment at 1,300° C. for 4 hours to obtain sintered bodies in which the oxygen deficiency was recovered. Moreover, all of the sintered bodies of the oxide raw material No. 1 that was the lot subjected to the alumina ball mill treatment and of the six kinds of the sintered bodies obtained from the oxide raw materials No. 11 to 15 were placed in an oxygen atmosphere furnace and subjected to an annealing treatment at 1,300° C. for 4 hours to obtain sintered bodies in which the oxygen deficiency was recovered. As the result, a total of 21 kinds of sintered bodies were prepared from the oxide raw materials No. 1 to 10: ten kinds of oxygen deficiency sintered bodies (Comparative Examples 1-1, 2 to 10); and 11 kinds of oxygen deficiency recovery sintered bodies (Examples 1 to 10, Comparative Example 1-2 (alumina ball treatment lot)), and five kinds of oxygen deficiency recovery sintered bodies (Comparative Examples 11 to 15) were prepared from the oxide raw materials No. 11 to 15. Thus, 26 kinds of sintered bodies were prepared in total.

Next, each resulting ceramic sintered body was ground and polished so as to have a diameter of 5 mm and a length of 15 mm, and both optical end faces of each sample were subjected to final optical polishing with an optical surface accuracy of $\lambda/8$ (when measurement wavelength $\lambda=633$ nm).

In this state, the weight of each sample was measured first and divided by the volume with a diameter of 5 mm and a length of 15 mm to measure the density of each. Furthermore, the theoretical density of each of the oxide raw materials No. 1 to 15 was calculated from each composition (shown in Table 1), and the occurrence amount of oxygen deficiency was calculated from the difference between these theoretical densities.

Next, the linear transmittance of each sample was measured as follows.

(Method for Measuring Linear Transmittance)

The linear transmittance was measured with the intensity of the light, which had a wavelength of 1,064 nm and was transmitted with a beam diameter of 1 to 3 mm$\phi$ by an optical system obtained by combining a light source manufactured by NKT Photonics, and a power meter and a Ge photodetector manufactured by Gentec, and was determined based on the following equation in accordance with JIS K7361 and JIS K7136:

Linear Transmittance(%/15 mm)=$I/I_0 \times 100$ wherein, I represents the intensity of the transmitted light (the intensity of the light transmitted linearly through a sample with a length of 15 mm), and $I_0$ represents the intensity of the incident light.

Figure 2:
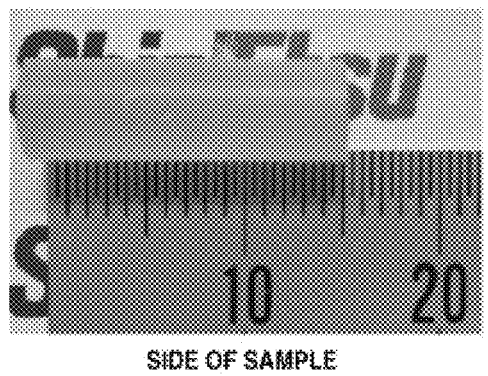
Figure 2:
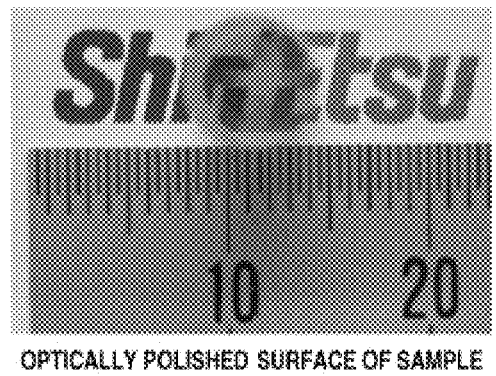

Subsequently, the optically polished sample was coated with an antireflection tiler designed to have a center wavelength of 1,064 nm. The optical appearance of the sample obtained herein was also checked. FIGS. 2(a) and 2(b) show the checking results of the optical appearance of the sample of Example 1 as an Example. As can be seen in FIGS. 2(a) and 2(b), the appearance was colorless and transparent as seen through the optically polished surfaces.

As shown in FIG. 1, polarizers were set in front of and behind each resulting ceramic sample, and this sample was inserted into the center of a neodymium-iron-boron magnet with an outer diameter of 32 mm, an inner diameter of 6 mm, and a length of 40 mm. Thereafter, a high power laser beam with a wavelength of 1,064 nm was input on the both end faces by using a high power laser (beam diameter: 1.6 mm) manufactured by IPG Photonics Corporation to measure the Verdet constant. Moreover, after the neodymium-iron-boron magnet was removed, a high power laser beam with a wavelength of 1,064 nm was input on each ceramic sample under the same conditions as described above. The temperature rise of each ceramic sample at that time was measured directly using an infrared thermoviewer.

(Method for Measuring Verdet Constant)

A Verdet constant V was determined based on the following equation. Note that a magnetic flux density B (T) applied to the sample was calculated by simulation based on the dimensions of the measurement system, a residual magnetic flux density (Br), and coercivity (Hc):

$$\theta = V \times B \times L$$

wherein $\theta$ is the Faraday rotation angle (rad), V is the Verdet constant (rad/(T·m)), B is the magnetic flux density (T), and L is the length of the Faraday rotator (0.015 m in this case).

(Method for Measuring Laser-Beam Input Temperature Rise)

Each sample was set on a light emission line of a high power laser (beam diameter 1.6 mm) manufactured by IPG Photonics Corporation, and the temperature of the sample surface before the high power laser emission was read by a commercially available thermoviewer focused on the sample surface. Then, a laser beam of 100 W obtained by oscillating a high power laser was input to the sample. As the result, the temperature of each sample rose according to the amount of absorption, and the temperature rise was saturated by keeping each sample irradiated for 20 minutes. The temperature of the sample surface was recorded at that time by the thermoviewer to obtain the difference with the temperature of the sample surface before high power laser emission, thereby obtaining the temperature rise when a laser beam of 100 W was input.

The above results are summarized in Table 2.

TABLE 2

|  | Oxide Raw Material No. | Oxygen Annealing after HIP | Amount of Oxygen Deficiency | Linear Transmittance (%/15 mm) | Verdet Constant (Rad/(T · m)) | Laser-beam Input Temperature Rise (° C.) | Note |
|---|---|---|---|---|---|---|---|
| Example 1 | 1 | Yes | <0.1% | 83.5 | 60 | 8 | |
| Comparative Example 1-1 | 1 | No | 0.30% | 81.6 | 60 | 29 | |

TABLE 2-continued

| | Oxide Raw Material No. | Oxygen Annealing after HIP | Amount of Oxygen Deficiency | Linear Transmittance (%/15 mm) | Verdet Constant (Rad/(T · m)) | Laser-beam Input Temperature Rise (° C.) | Note |
|---|---|---|---|---|---|---|---|
| Comparative Example 1-2 | 1 | Yes | <0.1% | <1.0 | Impossible to Measure | Impossible to Measure | Alumina Ball Treatment |
| Example 2 | 2 | Yes | <0.1% | 83.6 | 60 | 6 | |
| Comparative Example 2 | 2 | No | 0.30% | 81.9 | 60 | 27 | |
| Example 3 | 3 | Yes | <0.1% | 83.3 | 63 | 11 | |
| Comparative Example 3 | 3 | No | 0.30% | 80.8 | 63 | 48 | |
| Example 4 | 4 | Yes | <0.1% | 83.1 | 74 | 15 | |
| Comparative Example 4 | 4 | No | 0.40% | 80.2 | 74 | 58 | |
| Example 5 | 5 | Yes | <0.1% | 83.0 | 78 | 20 | |
| Comparative Example 5 | 5 | No | 0.40% | 79.1 | 78 | 64 | |
| Example 6 | 6 | Yes | <0.1% | 83.4 | 58 | 8 | |
| Comparative Example 6 | 6 | No | 0.30% | 81.5 | 58 | 32 | |
| Example 7 | 7 | Yes | <0.1% | 83.3 | 56 | 9 | |
| Comparative Example 7 | 7 | No | 0.30% | 81.3 | 56 | 34 | |
| Example 8 | 8 | Yes | <0.1% | 83.7 | 57 | 7 | |
| Comparative Example 8 | 8 | No | 0.30% | 81.7 | 57 | 28 | |
| Example 9 | 9 | Yes | <0.1% | 83.8 | 52 | 6 | |
| Comparative Example 9 | 9 | No | 0.30% | 82.0 | 52 | 27 | |
| Example 10 | 10 | Yes | <0.1% | 83.0 | 60 | 17 | |
| Comparative Example 10 | 10 | No | 0.30% | 79.8 | 60 | 61 | |
| Comparative Example 11 | 11 | Yes | <0.1% | 80.6 | 60 | 54 | |
| Comparative Example 12 | 12 | Yes | <0.1% | 80.1 | 60 | 60 | |
| Comparative Example 13 | 13 | Yes | <0.1% | 83.3 | 50 | 10 | Material Cost: 1.2 times |
| Comparative Example 14 | 14 | Yes | <0.1% | 81.2 | 80 | 34 | |
| Comparative Example 15 | 15 | Yes | <0.1% | 82.8 | 58 | 24 | |

From the above results, it was confirmed that highly-transparent paramagnetic garnet-type transparent ceramic bodies in which the oxygen deficiency amount was less than 0.1% and the linear transmittance was 83% or more were created from all the oxygen annealed Examples (Examples 1 to 10). Furthermore, it was confirmed that the temperature rise when a laser beam with an output of 100 W was input was also suppressed to 20° C. or less, and the generation of the thermal lens was able to be suppressed. On the other hand, in the Examples (Comparative Examples 1-1 and 2 to 10) in which oxygen deficiency more than 0.1%, specifically 0.3 to 0.4% was generated by the HIP treatment, the linear transmittance of each was less than 83%, and the temperature rise when a laser beam with an output of 100 W was input was also deteriorated to 27° C. or more.

Moreover, in Comparative Examples 11 and 12 in which the amount of Sc was too small, the perovskite different phase was generated as a subphase, the linear transmittance was under 83%, and the temperature rise when a laser beam with an output of 100 W was input was deteriorated to 50° C. or more. On the contrary, in Comparative Example 13 in which the amount of Sc is too large, it was confirmed that the Verdet constant was decreased and the raw material cost was to be significantly high. Furthermore, in Comparative Example 14 in which the added amount of Ce was too large, the linear transmittance was under 83%, and the temperature rise when a laser beam with an output of 100 W was input was deteriorated to 30° C. or more.

Figure 3:
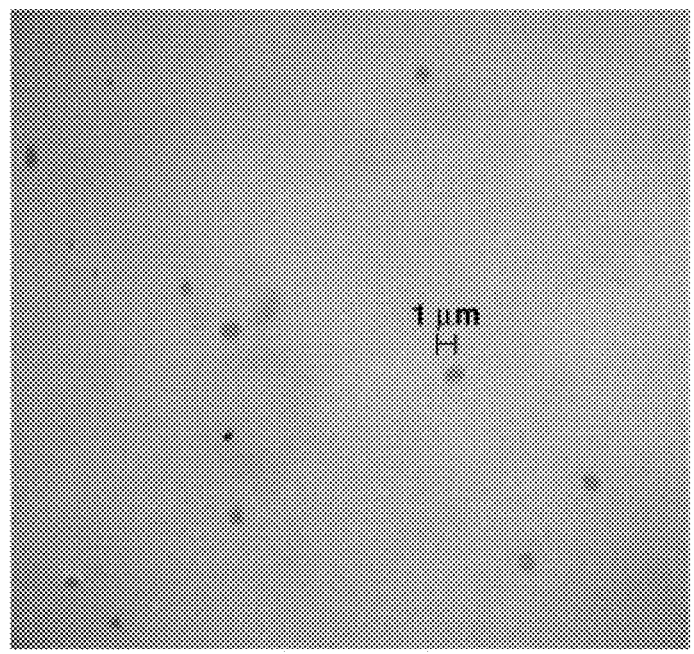
FIG. 3 is an optical micrograph of the surface of the sample in Comparative Example 1-2.

Moreover, in Comparative Example 1-2 in which the alumina ball mixing treatment was conducted, the sample was devitrified, and the linear transmittance at a thickness of 15 mm was less than 1%. When the sample was observed with a microscope, the alumina different phase with a particle diameter of about 1 μm was scattered, and a mixed crystal of a garnet phase and an alumina phase was generated. FIG. 3 shows an optical micrograph of the sample of Comparative Example 1-2. The abundance of the alumina different phase was about 5,000 ppm estimated from the micrograph.

Furthermore, in the Comparative Example 15 in which the amount of SiO₂ was 0.2% by weight, the temperature rise when a laser beam with an output of 100 W was input was deteriorated to 24° C. or more.

As described above, by controlling x, y, and z in the formula (1) within predetermined ranges, and limiting the occurrence amount of oxygen deficiency to less than 0.1% by oxidizing the atmosphere in the final annealing treatment step according to the conditions of the present embodiment, it is possible to provide a highly-transparent paramagnetic garnet-type transparent ceramic, in which the linear transmittance at a wavelength of 1,064 nm for a length of 15 mm is 83% or more, each of an alumina different phase and a perovskite different phase is 1 ppm or less, a Verdet constant at a wavelength of 1,064 nm is 51 rad/(T·m) or more, the temperature rise when a laser beam with a wavelength of 1,064 nm and an output of 100 W is input is 20° C. or less, and scattering is small. In addition, when this material is used as a magneto-optical material, it is possible to provide a high-performance magneto-optical device usable even for high power applications.

Note that, although the present invention has been described with reference to the above embodiments so far, the present invention is not limited to the above embodiments and can be changed within a scope that a person skilled in the art can conceive, such as other embodiments, additions, modifications and deletions, and any aspects are included in the scope of the present invention as long as the effects of the present invention are exerted.

REFERENCE SIGNS LIST

100 Optical isolator
110 Faraday rotator
120 Polarizer
130 Analyzer
140 Magnet

The invention claimed is:

1. A paramagnetic garnet-type transparent ceramic, which is a sintered body of complex oxide represented by the following formula (1), having a linear transmittance of 83% or more at a wavelength of 1,064 nm for an optical path length of 15 mm:

$$(Tb_{1-x-y}Sc_xCe_y)_3(Al_{1-z}Sc_z)_5O_{12} \quad (1)$$

wherein $0<x<0.08$, $0 \leq y \leq 0.01$, and $0.004<z<0.16$.

2. The paramagnetic garnet-type transparent ceramic according to claim 1 comprising $SiO_2$ as a sintering aid in an amount of more than 0% by weight to 0.1% by weight or less.

3. The paramagnetic garnet-type transparent ceramic according to claim 1, wherein an oxygen deficiency amount calculated from a difference between an actual density and a theoretical density of a transparent ceramic is less than 0.1%.

4. The paramagnetic garnet-type transparent ceramic according to claim 1, wherein a Verdet constant at the wavelength of 1,064 nm is 51 rad/(T·m) or more.

5. The paramagnetic garnet-type transparent ceramic according to claim 1, wherein a temperature rise is 20° C. or less when a laser beam with the wavelength of 1,064 nm is input thereto for 20 minutes with a beam diameter of 1.6 mm and input power of 100 W, for the optical path length of 15 mm.

6. A magneto-optical material made of the paramagnetic garnet-type transparent ceramic according to claim 1.

7. A magneto-optical device configured by using the magneto-optical material according to claim 6.

8. The magneto-optical device according to claim 7, comprising the paramagnetic garnet-type transparent ceramic as a Faraday rotator, wherein the magneto-optical device is an optical isolator which includes a polarization material in front of and behind the Faraday rotator on an optical axis and is usable at a wavelength band of 0.9 μm or more to 1.1 μm or less.

* * * * *